(12) United States Patent
Reinhardt et al.

(10) Patent No.: US 6,198,354 B1
(45) Date of Patent: Mar. 6, 2001

(54) SYSTEM FOR LIMITING IF VARIATION IN PHASE LOCKED LOOPS

(75) Inventors: Victor S. Reinhardt, Rancho Palos Verdes; Erik L. Soderburg, Torrance, both of CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/457,098

(22) Filed: Dec. 7, 1999

(51) Int. Cl.[7] .............................. H03L 7/06; H03L 7/085; H03L 7/18

(52) U.S. Cl. .................................. 331/17; 331/11; 331/16; 331/18; 331/22; 331/25; 327/156; 455/260

(58) Field of Search ....................... 331/10, 11, 16, 331/17, 18, 22, 25; 327/156–159; 455/260

(56) References Cited

U.S. PATENT DOCUMENTS 4,303,893 * 12/1981 Goldberg ........................... 331/1 A \* cited by examiner Primary Examiner—David Mis
(74) Attorney, Agent, or Firm—T. Gudmestad

(57) ABSTRACT

An apparatus for limiting intermediate frequency variation in a multiple conversion phase locked loop includes a reference oscillator and a voltage controlled oscillator (VCO). The reference oscillator generates a first reference frequency, while the VCO generates an output frequency. The output frequency is divided by a first VCO divider and mixed with the first reference frequency to generate a first intermediate frequency. A second VCO divider also divides the output frequency and mixes it with the first intermediate frequency to generate a second intermediate frequency, which is filtered and used to control the VCO. An algorithm processor generates the division constants of the first and second VCO dividers as a function of the reference frequency and the output frequency to limit intermediate frequency variation.

23 Claims, 1 Drawing Sheet

SYSTEM FOR LIMITING IF VARIATION IN PHASE LOCKED LOOPS

TECHNICAL FIELD

The present invention relates generally to phase locked loops, and more particularly, to a system for limiting intermediate frequency variation in multiple conversion phase locked loops.

BACKGROUND ART

Manufacturers of electronic equipment typically include phase locked loop synthesizers as components of many electronic products and systems. For example, phase locked loop synthesizers having voltage controlled oscillators are widely used as digital tuners for communication transmitters and receivers. They are also commonly used in controllers for variable speed motors.

A phase locked loop (hereinafter, referred to as a PLL) is an automatic control circuit for processing an output oscillation frequency which is completely synchronized with, or the same frequency as, the frequency of an input signal or a reference oscillator output signal. Generally, the PLL includes a phase comparator (or a phase detector), a low pass filter, and a voltage controlled oscillator, combined to form a feedback loop.

Typical PLL synthesizers are either single conversion PLLs or multiple conversion PLLs. In the operation of a single conversion PLL, a voltage controlled oscillator (VCO) at frequency fo is divided in frequency by N1, a fixed reference oscillator at frequency frosc is divided in frequency by Nr, and the divided frequencies are mixed together to produce an error signal which is driven to zero frequency ("DC") when the PLL is locked. Thus, when the loop is locked, frosc/Nr=fo/N1 and, $$fo=N1/Nr \cdot frosc \quad (1)$$

A loop filter amplifies and filters the error signal. The output of the loop filter controls the frequency of the VCO through its voltage control input, closing and locking the PLL.

The phase noise generated by a PLL synthesizer comes from 3 sources: the reference oscillator, the VCO and the PLL electronics. The primary problem with single conversion PLLs is that the phase noise spectrum at the VCO output due to the PLL electronics So(f) is given by, $$So=K \cdot (fo/fss)2 \quad (2)$$

where minimum frequency step size fss of the synthesizer due to changes in the dividers and K is a proportionality constant. Thus, the phase noise spectrum due to PLL electronics noise gets larger as the step size gets smaller, limiting the ability of single conversion PLLs to generate high frequencies with very small step sizes.

A multiple conversion PLL operates in the much the same manner. As before, a fixed reference oscillator at frequency frosc is divided in frequency by Nr. The Nr divider generates an output frequency fr. Thus, the reference oscillator frequency if given by, $$frosc=Nrfr \quad (3)$$

Also as before, divider N1 divides frequency fo and mixes this in a first mixer with frequency fr. In this case however, the output of this mixer is not zero frequency, but an intermediate frequency (IF) f1. A divider N2 outputs fo/N2, and this is mixed in a second mixer with f1 to produce a second IF f2. This process is repeated as many times as necessary using dividers N3 to Nn until the final mixer output is used to lock the PLL. The output frequency of this multiple conversion PLL is given by, $$fo=frosc/(N1-1 \pm N2-1 \ldots \pm Nn \pm 1) \cdot Nr \quad (4)$$

where the ±s are determined by the mixer sideband utilized for each mixer. A polarity switch is necessary because the sideband choices also determine the sense of the phase error in the final mixer output. Therefore, the minimum step fsm size of a multiple conversion PLL, assuming fr>>f1>>f2>> ... fn−1, is given by, $$fsm=N1fo/Nn2 \quad (5)$$

Thus, N1 can be chosen independently of the minimum step size because of the extra parameter Nn. This means the phase noise spectrum multiplication factor, which is still given by N12 (relative to the output at fr), is decoupled from the step size in multiple conversion PLLs. This decoupling is the main advantage of multiple conversion PLLs, i.e., fr can be chosen to minimize the phase noise, while the extra conversions supply as much resolution as needed.

There is a problem, however, in utilizing multiple conversion PLLs when fo is to operate over a large range. The problem is that the IFs can vary widely as fo is changed without proper IF management. If the IFs vary widely, spurs from unwanted mixing products cannot be properly filtered to keep them out of the VCO output and step size can vary widely over the output range. For proper PLL operation, the IFs need to be as low as possible and simultaneously much greater than the loop bandwidth (BL) of the PLL for all operating frequencies fo.

In order to get around the frequency range limitations of conventional multiple conversion PLLs, makers of electronic equipment utilize custom frequency crystal oscillators and multiplier chains to generate the desired frequencies. Unfortunately, custom frequency crystals for these oscillators require approximately six months to procure. Manufactures are forced to stock large quantities of these crystals in advance at additional expense for commercial applications to enable oscillator fabrication in a short period of time.

Therefore, there is a need to eliminate the extra complexity and expense of using custom frequency crystal oscillators by improving the performance of multiple conversion PLLs. There is also a need to improve the frequency output range of multiple conversion PLLs, while reducing output noise by limiting IF variation.

SUMMARY OF THE INVENTION

It is, therefore, an object of the invention to provide an improved and reliable multiple conversion PLL. Another object of the invention is to limit IF variation in multiple conversion PLLs.

In one aspect of the invention, an apparatus for limiting intermediate frequency variation in a multiple conversion phase locked loop includes a reference oscillator and a voltage controlled oscillator (VCO). The reference oscillator generates a first reference frequency, while the VCO generates an output frequency. The output frequency is divided by a first VCO divider and mixed with the first reference frequency to generate a first intermediate frequency. A second VCO divider also divides the output frequency and mixes it with the first intermediate frequency to generate a second intermediate frequency, which is filtered and used to control the VCO. An algorithm processor generates the division constants of the first and second VCO dividers as a function of the reference frequency and the output frequency to limit intermediate frequency variation.

The present invention thus achieves an improved multiple conversion PLL. The present invention is advantageous in that it extends the useful frequency range of a convention PLL by limiting IF variation.

Additional advantages and features of the present invention will become apparent from the description that follows, and may be realized by means of the instrumentalities and combinations particularly pointed out in the appended claims, taken in conjunction with the accompanying drawings.

BRIEF DESCRIPTION OF THE DRAWINGS

In order that the invention may be well understood, there will now be described some embodiments thereof, given by way of example, reference being made to the accompanying drawings, in which.

BEST MODES FOR CARRYING OUT THE INVENTION

Figure 1:
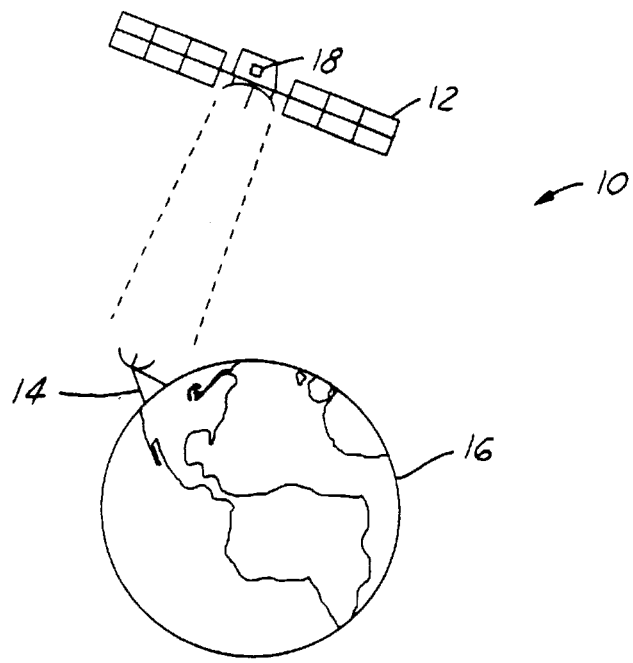
FIG. 1 is a perspective view of a satellite phase locked loop system according to one embodiment of the present invention.

Referring to FIG. 1, a perspective view of a satellite phase locked loop system 10 according to one embodiment of the present invention is illustrated. The satellite phase locked loop system 10 is comprised of one or more satellites 12 in communication with a ground station 14 located on the Earth 16. Each satellite 12 contains one or more systems for limiting IF variation in phase locked loops 18.

Figure 2:
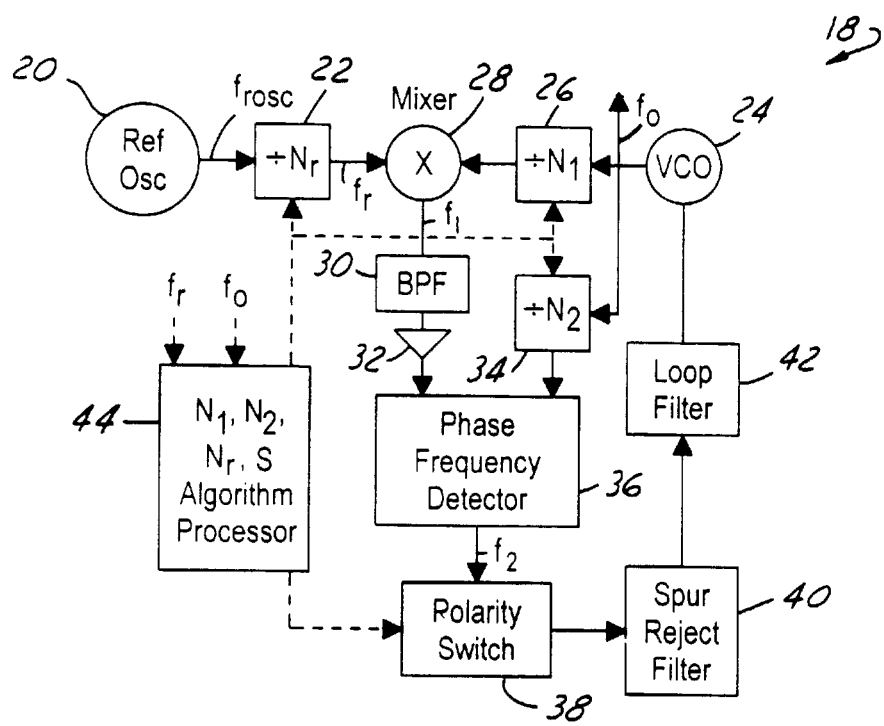
FIG. 2 is a block diagram of a system for limiting IF variation in phase locked loops according to one embodiment of the present invention.

Referring to FIG. 2, a block diagram of a system for limiting IF variation in phase locked loops 18 according to one embodiment of the present invention is illustrated. Solid lines show signal flow and dotted lines show data value flow. An apparatus for managing a first intermediate frequency f1 in a two conversion PLL will be addressed in detail. One skilled in the art, however, would recognize that the principles set forth for the two-conversion concept are easily generalized to multiple IFs in multiple conversion PLLs.

A two conversion PLL 18 includes a reference oscillator 20 that generates a first reference signal having a first reference frequency frose. A reference divider 22 divides first reference frequency frosc by a value Nr to generate a second reference signal having a second reference frequency fr. While the preferred embodiment includes reference divider 22, one skilled in the art recognizes that, in fact, reference divider 22 need not be present in some applications, i.e., when Nr is chosen to equal one.

A voltage controlled oscillator (VCO) 24 generates an output signal having an output frequency fo. The output frequency fo of VCO 24 is controlled by a VCO input. A first VCO divider 26 divides output frequency fo by a value N1 to generate a first VCO signal having a first VCO frequency, which is then mixed by mixer 28 to generate a first intermediate signal having a first intermediate frequency f1. The output of mixer 28, first intermediate frequency f1, is then bandpass filtered by a bandpass filter 30 and amplified by an amplifier 32. The principle purpose of bandpass filter 32 is to eliminate spurious products in the IF that are at multiples of fr. Since f1<<fr for all fo, a simple bandpass filter is all that is required.

A second VCO divider 34 divides output frequency fo by a value N2 to generate a second VCO signal having a second VCO frequency, which is then mixed by a second mixer 36 to generate a second intermediate signal having a second intermediate frequency f2. In the present example, second mixer 36 is a phase frequency detector, although similar mixers, such as a phase frequency comparator, may be used.

The feedback loop for control of VCO 24 includes a polarity switch 38, a spur rejection filter 40, and a loop filter 42. Polarity switch 38 switches the polarity, or polarizes, second intermediate frequency f2 in response to polarity switch value s to generate a polarized second intermediate signal. Spur rejection filter 40 eliminates spurs from phase frequency detector 36, which occur at multiples of f1, before the signal is again filtered (and possibly amplified) in a convention loop filter to produce the desired phase lock loop bandwidth (BL) characteristics. The loop filter can be passive or active and is typically a 2nd order loop filter. The output of the loop filter, a VCO control signal, drives the VCO input to close and lock the PLL.

An algorithm processor 44 is used to generate the parameters Nr, N1, N2, and s from fo and fr. To aid in describing how algorithm processor 44 is implemented, the output frequency fo of VCO 24 is written as, $$fo=(M+x)fr \tag{6}$$

where, $$M=\text{floor}(fo/fr) \tag{7}$$

and, $$x=(fo-Mfr)/fr \tag{8}$$

where floor(z) is defined as the largest integer which is less than or equal to the real number z. When fo varies from some minimum value to a maximum value, M varies from some minimum value Mmin to a maximum value Mmax with unit step size. Also, in general, x varies over the approximate range $0 \leq x \leq 1$ with very fine step size between M increments.

Letting, $$N1=M-U \tag{9}$$

where U is an integer to be determined later, mixer 28 outputs an IF equal to the absolute value of, $$f1=F(x,k,U) \cdot f1m \tag{10}$$

where, $$f1m=fr/Mmin \tag{11}$$

and, $$F(x,k,U)=(U+x)/(k-U/Mmin)=(U+x)/k \tag{12}$$

where $$k=M/Mmin \tag{13}$$

assuming in equation (12) that fo>>fr, which is the usual region of application for PLLs.

The selection of U is important for the proper operation of PLL 18. Without U, i.e., U=0, f1 goes to zero as x goes to zero. Since x varies rapidly from approximately 0 to 1, there will be many fo values for which f1 <BL, causing spur problems in PLL 18.

In a two-conversion PLL 18, the output of second mixer 36 is used to lock VCO 24, and so is at zero frequency. Thus the absolute value of the IF is equal to the output of second VCO divider 34 or fo/N2, so, $$fo=fr/(N1-1-(-1)s\cdot N2-1) \qquad (14)$$

where s=0 if f1 is positive, and s=1 if f1 is negative. Polarity switch value s is important not only to determine the sign in front of the N2 term, but to determine the sense of polarity switch 38. N2 is generated from x, M, and U by, $$N2=\text{floor}[(M+x)(M-U)/|U+x|] \qquad (15)$$

Using equation (15) the realizable values of x are not continuous but are limited in value by the requirement that N2 must be an integer. The floor function in equation (15) allows x to be chosen independently of any restrictions and to obtain the nearest realizable frequency value.

In terms of the variables x, K, and U, the step size is, $$fsm=Fs(x,k,U)fr/Mmin2 \qquad (16)$$

where $$Fs(x,k,U)=(U+x)2/k2 \qquad (17)$$

And the fractional step size can be written as, $$y=fsm/fo=Y(x,k,U)\cdot Mmin-3 \qquad (18)$$

where, $$Y(x,k,U)=(U+x)2/k3 \qquad (19)$$

To prevent the IF from going to zero, $Fs(0,1,U) \geq 1$ and $Y(0,1,U) \geq 1$.

Using the above formulas, algorithm processor 44 limits IFs by using output frequency fo of VCO 24 and second reference frequency fr to calculate M and x using equations (7) and (8). Algorithm processor 44 then determines Mmin using equation (7) with a minimum value of fo. Using this value algorithm processor 44 then calculates k using equation (13) to find the value of U which maximizes the absolute value of F(x,k,U) while keeping $Y(x,k,U) \leq 1$ (or $Fs(x,k,U) \leq 1$) and returns a value for U and F. (Note: it is only necessary to search U values from −1 to floor(k). Algorithm processor 44 then determines s from the sign of F and calculates N1 and N2 from equations (11) and (15).

Alternatively, the above process can be simplified and yield almost the same results as the exact algorithm. Algorithm processor 44 limits IFs by using output frequency fo of VCO 24 and second reference frequency fr to calculate M and x using equations (7) and (8). Algorithm processor 44 then determines Mmin using equation (7) with a minimum value of fo. Using this value algorithm processor 44 then calculates k using equation (13). If k<kd then U=1 if x<0.5 or U=0 if $x \geq 0.5$. If $k \geq kd$ the U=floor(k−kofs). (Note: for Y-optimization use kd=1.58 and kofs=0.1, for Fs-optimization use kd=2 and kofs=1.) Algorithm processor 44 then determines s from the sign of F and calculates N1 and N2 from equations (11) and (15).

From the foregoing, it can be seen that there has been brought to the art a new and improved system for limiting IF variation in phase locked loops. It is to be understood that the preceding description of the preferred embodiment is merely illustrative of some of the many specific embodiments that represent applications of the principles of the present invention. Clearly, numerous and other arrangements would be evident to those skilled in the art without departing from the scope of the invention as defined by the following claims.

What is claimed is:

1. An apparatus for limiting intermediate frequency variation in a multiple conversion phase locked loop, comprising:
   a reference oscillator generating a first reference signal, said first reference signal having a first reference frequency;
   a voltage controlled oscillator (VCO) generating an output signal, said output signal having an output frequency controlled by a VCO input;
   a first VCO divider coupled to said VCO and receiving said output signal, said first VCO divider dividing said output frequency by a first VCO divider value to generate a first VCO signal having a first VCO frequency, said first VCO signal coupled to said first reference signal to generate a first intermediate signal having a first intermediate frequency;
   a second VCO divider coupled to said VCO and receiving said output signal, said second VCO divider dividing said output frequency by a second VCO divider value to generate a second VCO signal having a second VCO frequency, said second VCO signal coupled to said first intermediate signal to generate a second intermediate signal having a second intermediate frequency;
   a loop filter coupled to said second VCO divider and receiving said second intermediate signal, said loop filter filtering said second intermediate signal to generate a VCO control signal, said VCO control signal coupled to said VCO input; and
   an algorithm processor coupled to said reference oscillator, said first VCO divider, said second VCO divider, and said VCO, said algorithm processor generating said first VCO divider value, and said second VCO divider value.

2. An apparatus for limiting intermediate frequency variation in a multiple conversion phase locked loop as recited in claim 1 further comprising a third VCO divider coupled between said first VCO divider and said second VCO divider, said third VCO divider coupled to said VCO and receiving said output signal, said third VCO divider dividing said output frequency by a third VCO divider value to generate a third VCO signal having a third VCO frequency, said third VCO signal coupled to said first intermediate signal to generate a third intermediate signal having a third intermediate frequency.

3. An apparatus for limiting intermediate frequency variation in a multiple conversion phase locked loop as recited in claim 2 wherein said algorithm processor is coupled to said third VCO divider and generates said third VCO divider value.

4. An apparatus for limiting intermediate frequency variation in a multiple conversion phase locked loop as recited in claim 1 further comprising a polarity switch coupled after said second VCO divider and receiving said second VCO signal, said polarity switch switching said second VCO signal, in response to a polarity switch value, to generate a polarized second intermediate signal.

5. An apparatus for limiting intermediate frequency variation in a multiple conversion phase locked loop as recited in claim 4 wherein said algorithm processor is coupled to said polarity switch and generates said polarity switch value.

6. An apparatus for limiting intermediate frequency variation in a multiple conversion phase locked loop as recited in claim 1 further comprising a spur rejection filter coupled before said loop filter and receiving said second intermediate signal, said spur rejection filter eliminating spurs at multiples of said first intermediate frequency.

7. An apparatus for limiting intermediate frequency variation in a multiple conversion phase locked loop as recited in claim 1 wherein said second VCO signal and said first intermediate signal are coupled to and mixed by a phase frequency detector to generate said second intermediate signal having said second intermediate frequency.

8. An apparatus for limiting intermediate frequency variation in a multiple conversion phase locked loop as recited in claim 1 further comprising a band pass filter coupled to said first intermediate signal to eliminate spurs at multiples of said first reference frequency.

9. An apparatus for limiting intermediate frequency variation in a multiple conversion phase locked loop as recited in claim 1 further comprising a reference oscillator divider coupled to said reference oscillator and receiving said first reference signal, said reference oscillator divider dividing said first reference frequency by a reference oscillator divider value to generate a second reference signal having a second reference frequency.

10. An apparatus for limiting intermediate frequency variation in a multiple conversion phase locked loop as recited in claim 9 wherein said algorithm processor is coupled to said reference oscillator divider and generates said reference oscillator divider value.

11. A satellite phase locked loop system, comprising:
a ground station;
a satellite in orbit and in communication with said ground station; and
an apparatus for limiting intermediate frequency variation in a multiple conversion phase locked loop located in said satellite, said apparatus comprising:
a reference oscillator generating a first reference signal, said first reference signal having a first reference frequency;
a voltage controlled oscillator (VCO) generating an output signal, said output signal having an output frequency controlled by a VCO input;
a first VCO divider coupled to said VCO and receiving said output signal, said first VCO divider dividing said output frequency by a first VCO divider value to generate a first VCO signal having a first VCO frequency, said first VCO signal coupled to said first reference signal to generate a first intermediate signal having a first intermediate frequency;
a second VCO divider coupled to said VCO and receiving said output signal, said second VCO divider dividing said output frequency by a second VCO divider value to generate a second VCO signal having a second VCO frequency, said second VCO signal coupled to said first intermediate signal to generate a second intermediate signal having a second intermediate frequency;
a loop filter coupled to said second VCO divider and receiving said second intermediate signal, said loop filter filtering said second intermediate signal to generate a VCO control signal, said VCO control signal coupled to said VCO input; and
an algorithm processor coupled to said reference oscillator, said first VCO divider, said second VCO divider, and said VCO, said algorithm processor generating said first VCO divider value, and said second VCO divider value.

12. An apparatus for limiting intermediate frequency variation in a multiple conversion phase locked loop as recited in claim 11 further comprising a third VCO divider coupled between said first VCO divider and said second VCO divider, said third VCO divider coupled to said VCO and receiving said output signal, said third VCO divider dividing said output frequency by a third VCO divider value to generate a third VCO signal having a third VCO frequency, said third VCO signal coupled to said first intermediate signal to generate a third intermediate signal having a third intermediate frequency.

13. An apparatus for limiting intermediate frequency variation in a multiple conversion phase locked loop as recited in claim 12 wherein said algorithm processor is coupled to said third VCO divider and generates said third VCO divider value.

14. An apparatus for limiting intermediate frequency variation in a multiple conversion phase locked loop as recited in claim 11 further comprising a polarity switch coupled after said second VCO divider and receiving said second VCO signal, said polarity switch switching said second VCO signal, in response to a polarity switch value, to generate a polarized second intermediate signal.

15. An apparatus for limiting intermediate frequency variation in a multiple conversion phase locked loop as recited in claim 14 wherein said algorithm processor is coupled to said polarity switch and generates said polarity switch value.

16. An apparatus for limiting intermediate frequency variation in a multiple conversion phase locked loop as recited in claim 11 further comprising a spur rejection filter coupled before said loop filter and receiving said second intermediate signal, said spur rejection filter eliminating spurs at multiples of said first intermediate frequency.

17. An apparatus for limiting intermediate frequency variation in a multiple conversion phase locked loop as recited in claim 11 wherein said second VCO signal and said first intermediate signal are coupled to and mixed by a phase frequency detector to generate said second intermediate signal having said second intermediate frequency.

18. An apparatus for limiting intermediate frequency variation in a multiple conversion phase locked loop as recited in claim 11 further comprising a band pass filter coupled to said first intermediate signal to eliminate spurs at multiples of said first reference frequency.

19. An apparatus for limiting intermediate frequency variation in a multiple conversion phase locked loop as recited in claim 11 further comprising a reference oscillator divider coupled to said reference oscillator and receiving said first reference signal, said reference oscillator divider dividing said first reference frequency by a reference oscillator divider value to generate a second reference signal having a second reference frequency.

20. An apparatus for limiting intermediate frequency variation in a multiple conversion phase locked loop as recited in claim 19 wherein said algorithm processor is coupled to said reference oscillator divider and generates said reference oscillator divider value.

21. A method for limiting intermediate frequency variation in a multiple conversion phase locked loop, comprising the steps of:
generating a first reference signal having a first reference frequency;
generating an output signal having an output frequency;
controlling said output frequency in response to a VCO control signal;
dividing said output frequency of said output signal by a first VCO divider value to generate a first VCO signal having a first VCO frequency;
mixing said first reference frequency of said first reference signal with said first VCO frequency of said first VCO signal to generate a first intermediate signal having a first intermediate frequency;

dividing said output frequency of said output signal by a second VCO divider value to generate a second VCO signal having a second VCO frequency;

mixing said second VCO frequency of said second VCO signal with said first intermediate frequency of said first intermediate signal to generate a second intermediate signal having a second intermediate frequency;

filtering said second intermediate frequency of said second intermediate signal to generate said VCO control signal;

generating said first VCO divider value as a function of said first reference frequency and said output frequency; and generating said second VCO divider value as a function of said first reference frequency and said output frequency.

22. A method for limiting intermediate frequency variation in a multiple conversion phase locked loop as recited in claim 21, further comprising the steps of:

dividing said first reference frequency of said first reference signal by a reference oscillator divider value to generate a second reference signal having a second reference frequency; and generating said reference oscillator divider value as a function of said first reference frequency and said output frequency.

23. A method for limiting intermediate frequency variation in a multiple conversion phase locked loop as recited in claim 21, further comprising the steps of:

polarizing said second intermediate frequency of said second VCO signal, in response to a polarity switch value, to generate a polarized second intermediate signal;

generating said polarity switch value as a function of said first reference frequency and said output frequency.

* * * * *